US011081384B2

(12) United States Patent
Gruber et al.

(10) Patent No.: US 11,081,384 B2
(45) Date of Patent: Aug. 3, 2021

(54) METHOD FOR STABILIZING A SEMICONDUCTOR ARRANGEMENT

(71) Applicant: Infineon Technologies AG, Neubiberg (DE)

(72) Inventors: Hermann Gruber, Woerth a. D. (DE); Joerg Busch, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/388,632

(22) Filed: Apr. 18, 2019

(65) Prior Publication Data

US 2019/0326155 A1    Oct. 24, 2019

(30) Foreign Application Priority Data

Apr. 19, 2018 (DE) .......................... 102018109433.7

(51) Int. Cl.
*H01L 21/762* (2006.01)
*H01L 23/00* (2006.01)
*H01L 23/532* (2006.01)
*H01L 23/495* (2006.01)

(52) U.S. Cl.
CPC ...... *H01L 21/762* (2013.01); *H01L 23/49579* (2013.01); *H01L 23/5329* (2013.01); *H01L 24/32* (2013.01); *H01L 24/83* (2013.01); *H01L 2224/325* (2013.01)

(58) Field of Classification Search
CPC ............. H01L 21/762; H01L 23/49579; H01L 23/5329; H01L 24/32; H01L 24/83; H01L 2224/325
See application file for complete search history.

(56) References Cited

U.S. PATENT DOCUMENTS

| 5,004,705 | A | 4/1991 | Blackstone |
| 5,851,845 | A | 12/1998 | Wood et al. |
| 9,761,525 | B1 | 9/2017 | Hook et al. |
| 2003/0113976 | A1 | 6/2003 | Hau-Riege et al. |
| 2011/0298130 | A1* | 12/2011 | Kang ............ H01L 23/481 257/738 |
| 2013/0015504 | A1* | 1/2013 | Kuo ............ H01L 27/0694 257/213 |
| 2016/0020175 | A1* | 1/2016 | Kuo ............ H01L 25/065 257/783 |
| 2016/0284675 | A1* | 9/2016 | Fay ............ H01L 24/73 |
| 2016/0336990 | A1 | 11/2016 | Petzold et al. |

FOREIGN PATENT DOCUMENTS

DE   19543540 C1   11/1996
WO   2016077637 A1   5/2016

* cited by examiner

*Primary Examiner* — Timor Karimy
(74) *Attorney, Agent, or Firm* — Murphy, Bilak & Homiller, PLLC (57) ABSTRACT

A method includes producing a semiconductor arrangement having a semiconductor layer, a first insulation layer arranged on the semiconductor layer and facing a first surface of the semiconductor arrangement, and an insulating via extending in a vertical direction through the semiconductor layer as far as the first insulation layer, the insulating via surrounding a region of the semiconductor layer in a ring-shaped fashion. The method further includes permanently securing a first carrier to the first surface of the semiconductor arrangement.

20 Claims, 9 Drawing Sheets

METHOD FOR STABILIZING A SEMICONDUCTOR ARRANGEMENT

TECHNICAL FIELD

This description relates to a method for stabilizing a semiconductor arrangement, in particular a semiconductor arrangement comprising a plurality of dielectrically isolated semiconductor regions.

BACKGROUND

In a semiconductor arrangement comprising a plurality of semiconductor regions dielectrically isolated from one another, it is possible to realize semiconductor components dielectrically isolated from one another and/or electronic circuits dielectrically isolated from one another. The semiconductor regions dielectrically isolated from one another can be realized for example by means of one or more dielectric layers extending in a vertical direction through a semiconductor layer as far as a further dielectric layer applied on a surface of the semiconductor layer. For various reasons it may be desirable to realize the semiconductor layer such that it is very thin, such as, for example, with a thickness in the range of a few 10 micrometers ($\mu m$). The further dielectric layer has for example a thickness of from a few 100 nanometers (nm) to a few micrometers, as result of which the thickness of the semiconductor arrangement is likewise only in the range of a few 10 micrometers. On account of this small thickness, the semiconductor arrangement is handleable with difficulty, that is to say is for example difficult to mount on a leadframe.

SUMMARY

One example relates to a method. The method comprises permanently securing a first carrier to a first surface of a semiconductor arrangement, wherein the semiconductor arrangement comprises a semiconductor layer, a first insulation layer arranged on the semiconductor layer, and an insulating via. In this case, the first insulation layer faces the first surface of the semiconductor arrangement. The insulating via extends in a vertical direction through the semiconductor layer as far as the first insulation layer and surrounds a region of the semiconductor layer in a ring-shaped fashion.

Those skilled in the art will recognize additional features and advantages upon reading the following detailed description, and upon viewing the accompanying drawings.

BRIEF DESCRIPTION OF THE FIGURES

Examples are explained below with reference to drawings. The drawings serve to illustrate specific principles, and so only features necessary for an understanding of these principles are illustrated. The drawings are not true to scale. In the drawings, identical reference signs designate identical features.

DETAILED DESCRIPTION

In the following description, reference is made to the accompanying drawings, which form part of the description. It goes without saying that the features of the individual drawings can be combined with one another, unless indicated otherwise.

Figure 1A:
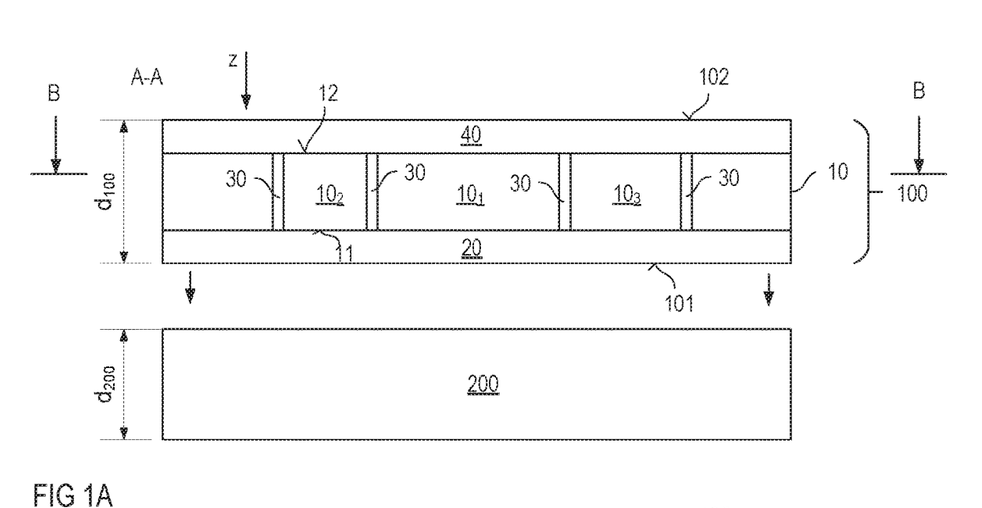
FIGS. 1A-1B show one example of a method for stabilizing a semiconductor arrangement by permanently securing a first carrier to a first surface of the semiconductor arrangement.
Figure 1B:
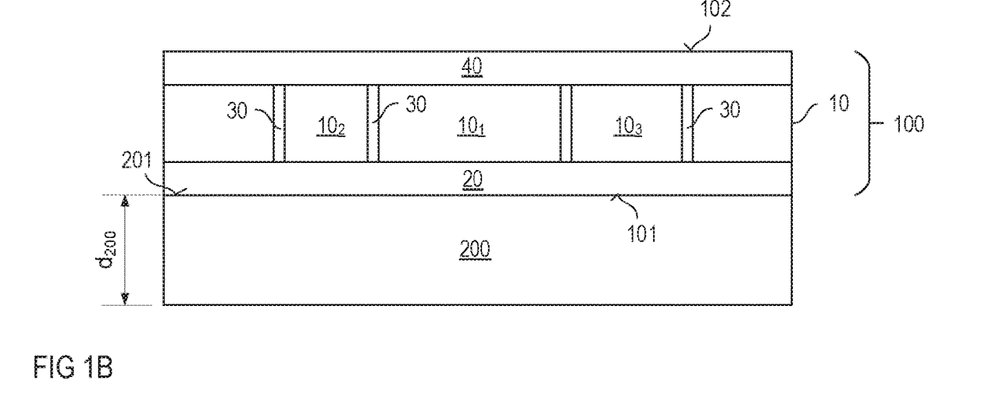

FIGS. 1A and 1B illustrate one example of a method for mechanically stabilizing a semiconductor arrangement 100 comprising a semiconductor layer 10, a first insulation layer 20 arranged on a first surface 11 of the semiconductor layer 10, and an electrically insulating via 30 extending in a vertical direction z through the semiconductor layer 10 as far as the first insulation layer 20, wherein the via 30 surrounds a region $10_1$, $10_2$, $10_3$ of the semiconductor layer 10 in a ring-shaped fashion in a horizontal plane of the semiconductor layer 10. FIGS. 1A and 1B show the semiconductor arrangement 100 comprising the semiconductor layer 10 in a vertical sectional plane that is a sectional plane extending perpendicular to the first surface 11 of the semiconductor layer 10. The "horizontal plane" is a plane of the semiconductor layer 10 extending perpendicular to the sectional plane illustrated in FIGS. 1A and 1B. Merely by way of example, FIGS. 1A and 1B illustrate three regions $10_1$, $10_2$, $10_3$ of the semiconductor layer 10. The number of semiconductor regions surrounded by the via in a ring-shaped fashion can be as desired. Various possibilities as to how said regions $10_1$, $10_2$, $10_3$ can be formed by the via 30 or can be surrounded by the latter are additionally explained further below.

In accordance with one example, the semiconductor arrangement 100 comprises a second insulation layer 40 arranged on a second side 12 of the semiconductor layer 10, said second side facing away from the first insulation layer 20. Each of the first and second insulation layers 20, 40 can consist in each case of just one electrically insulating material. Examples of such an electrically insulating material encompass an oxide, a nitride, an imide, or the like. In a further example, provision is made for realizing at least one of the first and second insulation layers 20, 40 such that this insulation layer comprises a layer stack having a plurality of layers composed of different electrically insulating materials. In accordance with one example, provision is made for the first insulation layer 20 to be a continuous layer composed of a semiconductor oxide, such as silicon oxide ($SiO_2$), for example, and for the second insulation layer 40 to comprise two or more different electrically insulating materials, such as, for example, an oxide, a nitride, an imide or the like.

The semiconductor arrangement 100 has a thickness $d_{100}$ in the vertical direction z. In accordance with one example, provision is made for said thickness $d_{100}$ to be between 30 micrometers (μm) and 100 micrometers, in particular between 40 micrometers and 60 micrometers, wherein the thickness of the first insulation layer 20 is for example between 5 micrometers and 15 micrometers and the thickness of the second insulation layer 40 is for example between 5 micrometers and 20 micrometers. In the individual regions $10_1$, $10_2$, $10_3$ of the semiconductor layer 10 that are defined by the via 30, individual semiconductor components and/or semiconductor circuits can be integrated, which can be fabricated by means of conventional semiconductor processes before the insulation layers 20, 40 are produced. In accordance with one example, provision is made for firstly producing the semiconductor layer 10 such that it is thicker than is ultimately necessary in the vertical direction (the direction perpendicular to the surface 12), and for partly removing said semiconductor layer 10 after producing the second insulation layer 40 on the side facing away from the insulation layer 40 before the first insulation layer 20 is produced. One example in respect of this is additionally explained further below.

Terminals of the semiconductor components and/or integrated circuits explained above can be accessible at the surface of the second insulation layer 40 in a manner not illustrated more specifically in FIGS. 1A and 1B. In order to be able to connect said semiconductor components and/or the integrated circuits to other components or integrated circuits, it may be desirable to accommodate the semiconductor arrangement 100 in a semiconductor package (not illustrated in the figures) and then to arrange said package on a printed circuit board (not illustrated in the figures) or to arrange the semiconductor arrangement 100 as such directly on a printed circuit board. However, this necessitates handling the semiconductor arrangement 100, which may be difficult on account of the small thickness, such as, for example, the abovementioned thickness of between 30 and 100 μm. In order to simplify the handling of such a thin semiconductor arrangement 100, provision is made, in accordance with FIGS. 1A and 1B, for permanently securing a first carrier 200 to a first surface 101 of the semiconductor arrangement 100. The first insulation layer 20 is arranged between said first surface 101 of the semiconductor arrangement 100 and the semiconductor layer 10 and forms the first surface 101 of the semiconductor arrangement 100 in the case of the example shown in FIGS. 1A and 1B. In accordance with a further example explained further below, a further layer can be arranged on the first insulation layer 20, which forms the first surface 101 in this case.

FIG. 1A shows a vertical sectional view of the semiconductor arrangement 100 and of the first carrier 200 before securing the first carrier 200 to the first surface 101 of the semiconductor arrangement, and FIG. 1B shows a cross section of an overall arrangement that arises as a result of securing the first carrier 200 to the first surface 101 of the semiconductor arrangement 100. In accordance with one example, a thickness $d_{200}$ of the carrier 200 is between 150 μm and 700 μm, as a result of which a thickness $d_{100}+d_{200}$ of the overall arrangement is between 180 μm and 800 μm. On account of the significantly larger thickness $d_{100}+d_{200}$ in comparison with the thickness $d_{100}$ of the semiconductor arrangement 100, the overall arrangement is handleable significantly more easily than the thin semiconductor arrangement 100 alone. In addition to contributing to the mechanical stabilization of the semiconductor arrangement 100, the carrier 200 can furthermore contribute to dissipating heat from the semiconductor arrangement 100 or to a more uniform temperature distribution in the semiconductor arrangement 100. The carrier 200 can contain or consist of a semiconducting material, such as, for example, silicon or aluminum nitride (AlN), a metal, such as, for example, copper (Cu) or iron (Fe), a metal alloy, or an insulator, such as glass, for example.

Figure 2A:
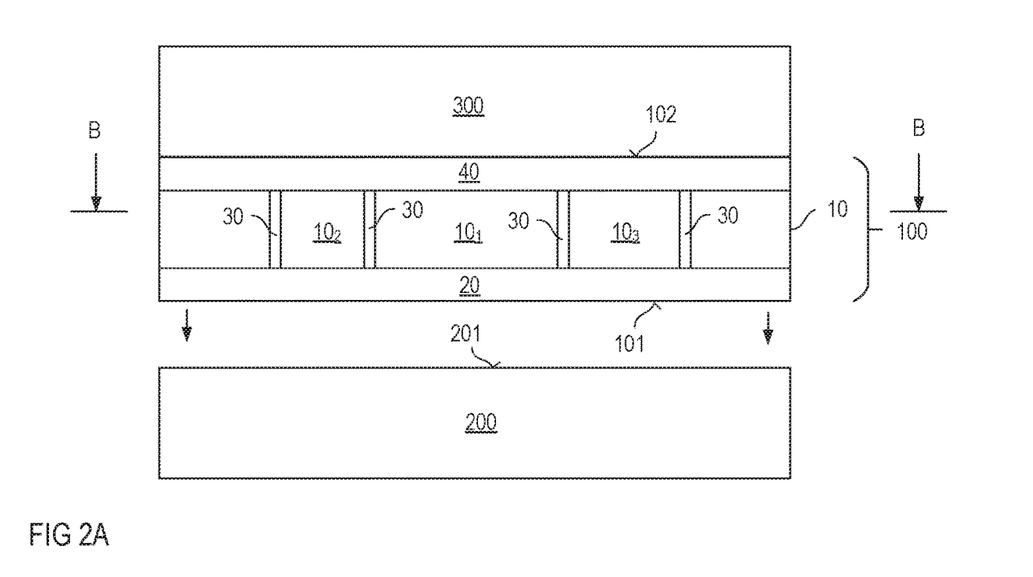
FIGS. 2A-2B illustrate carrying out a method in accordance with FIGS. 1A-1B using a second carrier arranged at a second surface of the semiconductor arrangement.
Figure 2B:
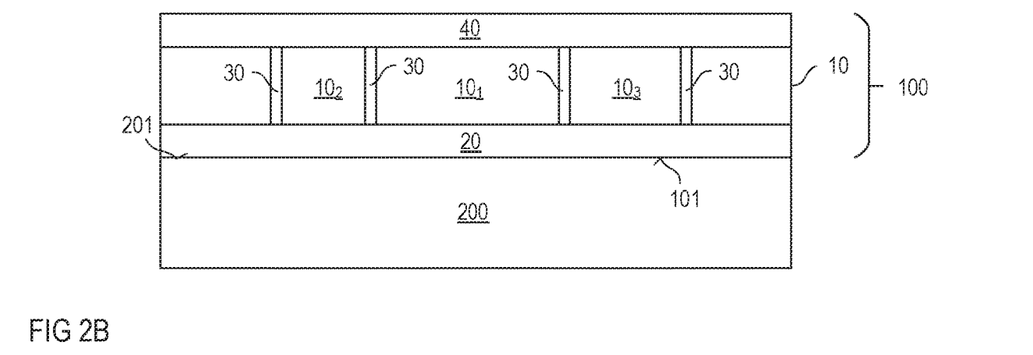

FIGS. 2A-2B illustrate a configuration of the method in accordance with FIGS. 1A-1B, wherein a second carrier 300 is used for handling the semiconductor arrangement 100 for permanently securing the semiconductor arrangement 100 to the first carrier 200. Said second carrier 300 is temporarily secured to a second surface 102 of the semiconductor arrangement 100, said second surface being situated opposite the first surface 101, and stabilizes the semiconductor arrangement 100 before the process of securing the latter to the first carrier 200. FIG. 2A shows a vertical sectional view of the semiconductor arrangement 100 with the second carrier 300 secured to the second surface 102, and of the first carrier 200 before the process of securing the semiconductor arrangement to the first carrier 200. The second carrier 300 is removed after the process of securing the semiconductor arrangement 100 to the first carrier 200. The result of this is illustrated in FIG. 2B, which shows a vertical sectional view of the semiconductor arrangement 100 secured to the first carrier 200 after the process of removing the second carrier 300.

The second surface 102 of the semiconductor arrangement 100, to which the second carrier 300 is secured, is a surface of the second insulation layer 40 in the case of the example shown in FIGS. 2A and 2B. The second carrier 300 consists of a glass, for example, and is secured to the semiconductor arrangement 100 for example by means of an adhesive layer, which is not illustrated in the figures.

Figure 3A:
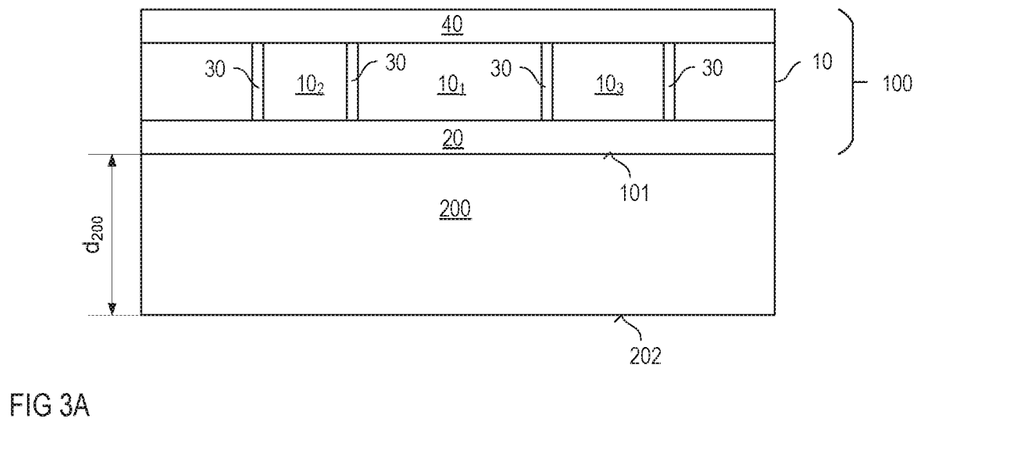
FIGS. 3A-3B illustrate a modification of the method in accordance with FIGS. 1A-1B.
Figure 3B:
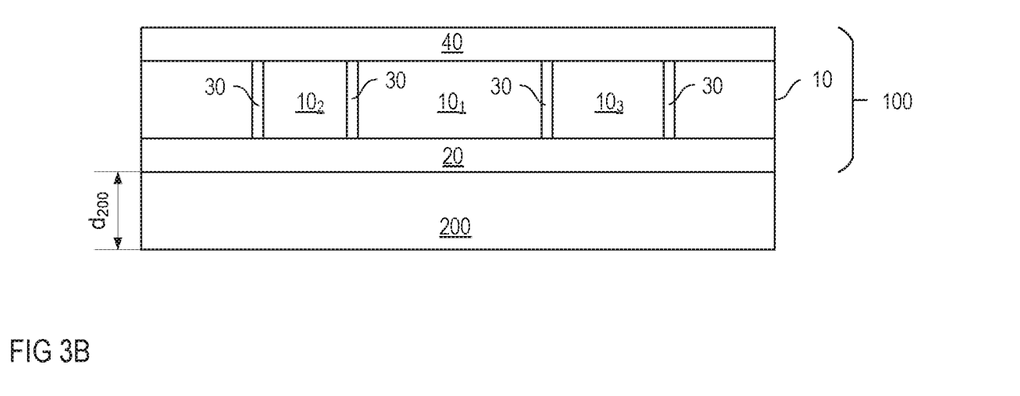

FIGS. 3A-3B illustrate a modification of the method illustrated in FIGS. 1A-1B. The method illustrated in FIGS. 3A-3B provides for reducing the thickness of the first carrier 200 after securing to the semiconductor arrangement 100. FIG. 3A shows the overall arrangement comprising the semiconductor arrangement 100 and the first carrier 200 directly after the process of securing the first carrier 200 to the semiconductor arrangement 100. FIG. 3B shows the overall arrangement after reducing the thickness of the first carrier 200, such that the thickness $d_{200}'$ thereof is less than a thickness $d_{200}$ directly after the process of securing the first carrier 200 to the semiconductor arrangement 100. Reducing the thickness of the first carrier 200 can comprise an arbitrary removal process by which material of the first carrier 200 is removed at a side 202 of the first carrier 200 facing away from the first surface 101 of the semiconductor arrangement 100. Such a removal process comprises, for example, at least one of the following: a braiding process, an edging process, a chemical mechanical polishing process (CMP process). In accordance with one example, provision is made for reducing the thickness of the first carrier 200 by 25% to 50% proceeding from the original thickness $d_{200}$ directly after securing the first carrier 200 to the semiconductor arrangement 100. In particular, a first carrier 200 composed of a semiconducting material such as silicon (Si), for example, is suitable for such removal. However, a first carrier 200 composed of a metal or a glass can also be used. The thickness of a first carrier 200 composed of Si is for example between 600 micrometers and 750 micrometers before the "thinning" and between 200 micrometers and 600 micrometers after the thinning.

Figure 4:
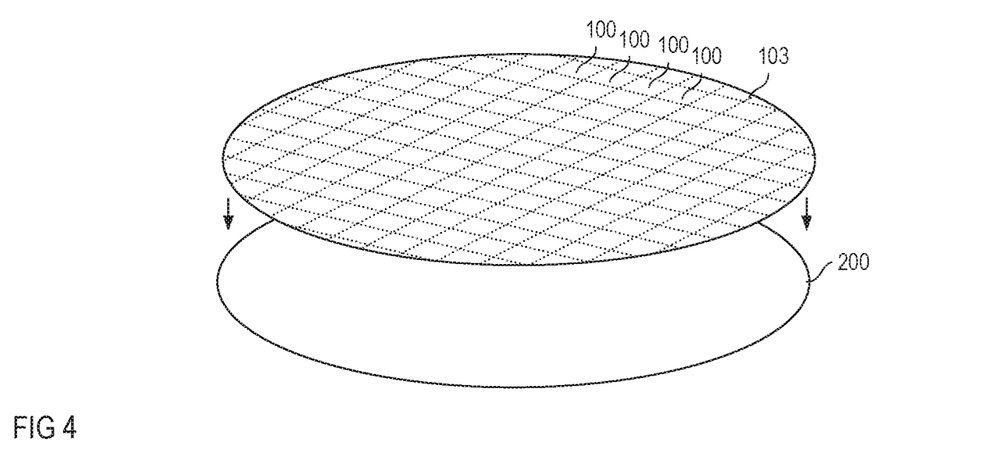
FIG. 4 illustrates a wafer comprising a multiplicity of semiconductor arrangements.

One example provides for securing the semiconductor arrangement 100 to the first carrier 200 when the semiconductor arrangement 100 is still part of a wafer comprising a multiplicity of continuous semiconductor arrangements 100 of identical type. Such a wafer is illustrated schematically in FIG. 4. In addition to the wafer comprising the multiplicity of semiconductor arrangements 100, the first carrier 200 is also illustrated in FIG. 4, said first carrier in this example forming the first carrier for the multiplicity of semiconductor arrangements 100. A size of said first carrier 200 can correspond to the size of the wafer, but the first carrier 200 can also be larger than the wafer. Separating lines between the individual semiconductor arrangements 100 are illustrated in a dotted manner in FIG. 4. The overall arrangement that arises as a result of securing the first carrier 200 to the wafer, and thus to the multiplicity of semiconductor arrangements 100, can be divided along said separating lines, for example by sawing or laser cutting, in order thereby to obtain a multiplicity of individual arrangements each comprising a semiconductor arrangement 100 and a first carrier 200.

Various methods can be employed for permanently securing the first carrier 200 to the first surface 101 of the semiconductor arrangement 100. Examples of such methods are explained below.

In accordance with one example, provision is made for securing the first carrier 200 to the first surface 101 of the semiconductor arrangement 100 by contacting a first surface 201 of the first carrier 200 with the first surface 101 of the semiconductor arrangement 100 and by carrying out a thermal process at temperatures of less than 350° C. An arrangement produced by such a method is illustrated in cross section in FIG. 5.

Figure 5:
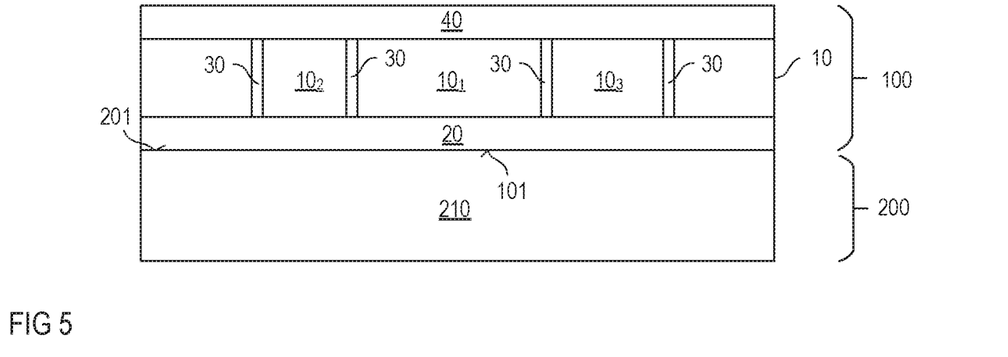
FIGS. 5-8 illustrate various examples for securing the first carrier to the first surface of the semiconductor arrangement.

In this case, the first carrier 200 is for example a carrier composed of a semiconductor material, such as a silicon carrier, for example, and the first insulation layer 20 is for example a semiconductor oxide layer, such as a silicon dioxide (SiO$_2$) layer, for example. Alternatively, the first carrier 200 can consist of the same material as the first insulation layer 20.

Figure 6:
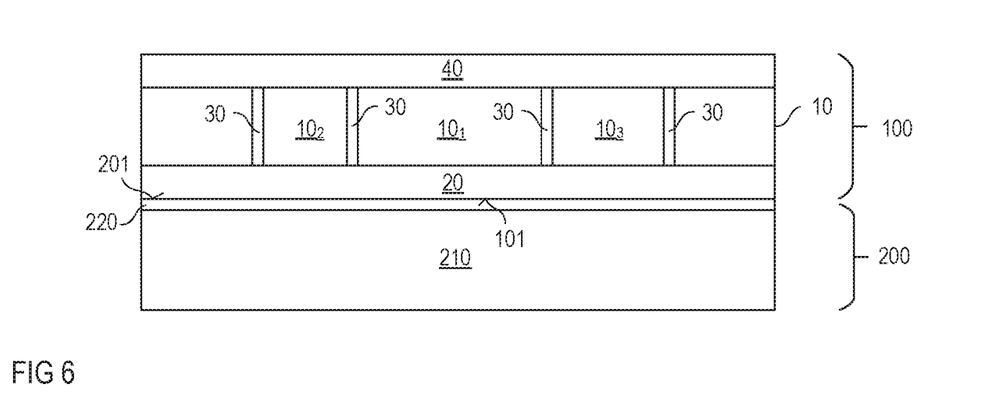

In accordance with a further example illustrated in FIG. 6, provision is made for the first carrier 200 to comprise a connection layer 20 along the first surface 201, said connection layer being of the same type as the first insulation layer 20. In this case, the semiconductor arrangement 100 and the carrier 200 can likewise be connected to one another by being placed one on top of the other and by a thermal process. In accordance with one example, the first insulation layer 20 and the connection layer 220 are in each case an oxide layer. Below the connection layer 220, the first carrier 200 can comprise an arbitrary carrier layer 210, or else a layer stack composed of a plurality of different carrier layers. The carrier layer 210 consists, for example, of a semiconductor material, a metal or an insulator, such as e.g. glass.

Figure 7:
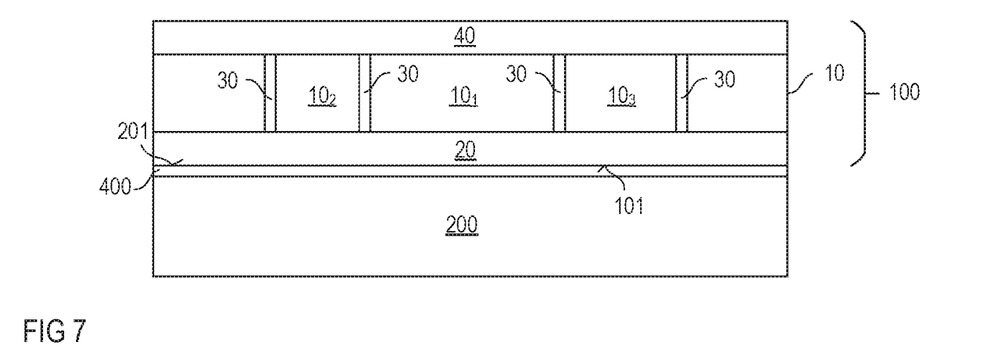

In a further example for securing the first carrier 200 to the semiconductor arrangement 100, provision is made for securing the first carrier 200 to the semiconductor arrangement 100 by means of a securing layer 400. FIG. 7 shows in cross section an overall arrangement in which the first carrier 200 was secured to the semiconductor arrangement 100 in this way. The securing layer 400 is an adhesive layer, for example, and comprises BCB (benzocyclobutene), for example. The first carrier 200 can comprise an arbitrary carrier material or else a layer stack having a plurality of layers composed of different carrier materials. The adhesive layer 400 can be applied directly on the first insulation layer 200 of the semiconductor arrangement 100.

Figure 8:
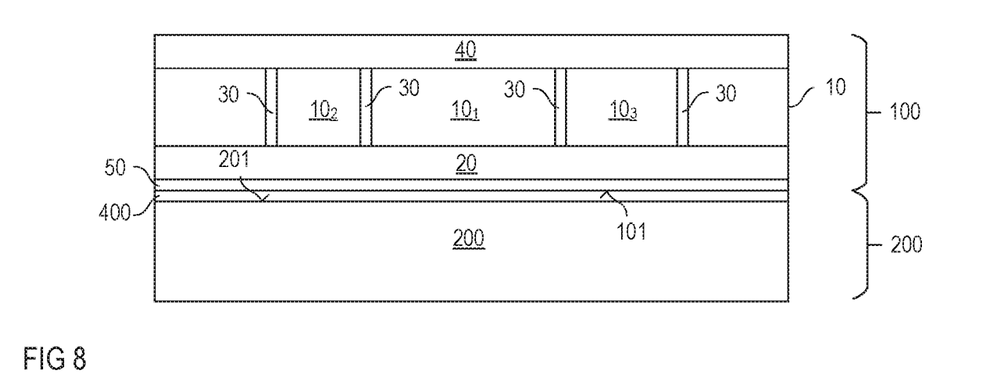

In a further example of a securing method, the result of which is illustrated in FIG. 8, the semiconductor arrangement 100 comprises a metallization 50 on the first insulation layer 20. Said metallization 50 forms the first surface 101 of the semiconductor arrangement 100. In this case, the carrier 200 is secured to the first surface 201 of the first carrier 200 using the securing layer 400. The securing layer 400 is an adhesive layer or a solder layer, for example. When a solder layer is used as securing layer 400, the first carrier 200 comprises a metallization for example at least along the surface at which the solder layer contacts the first carrier 200.

Figure 9A:
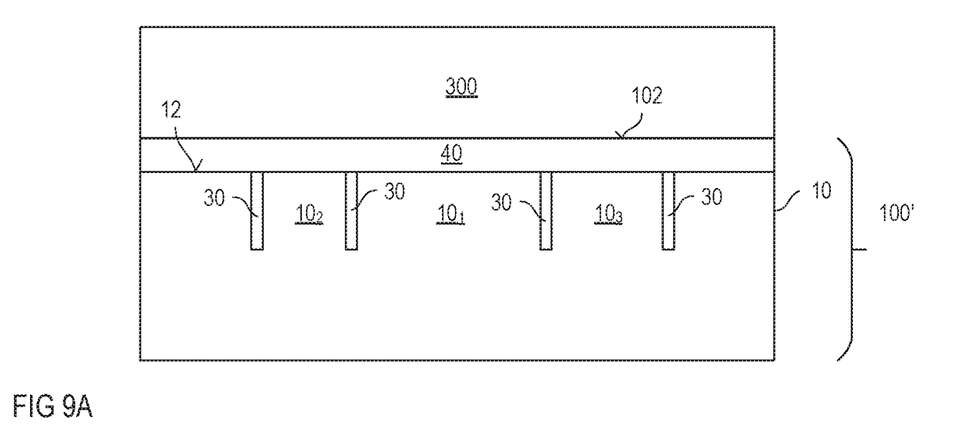
FIGS. 9A-9C illustrate one example for producing the semiconductor arrangement.
Figure 9B:
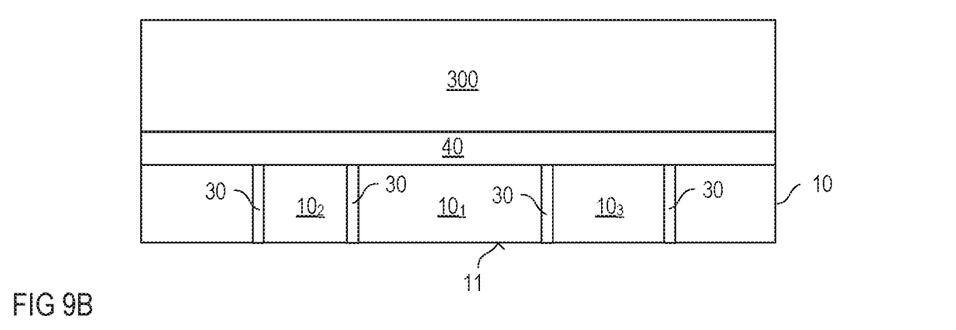
Figure 9C:
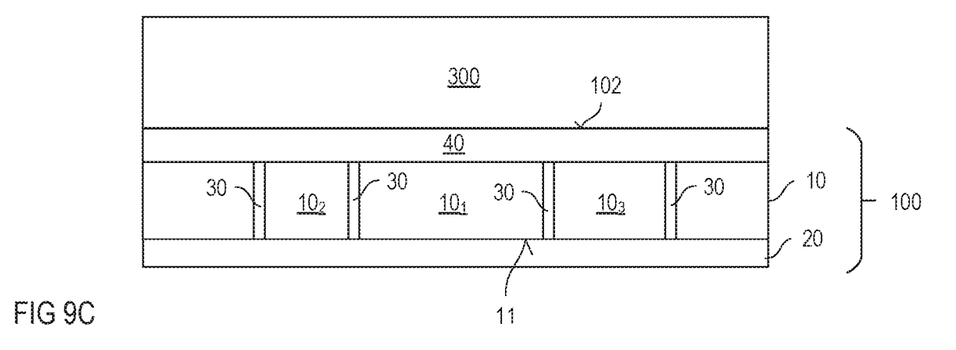

As was explained with reference to FIGS. 2A and 2B, a second carrier 300 can be provided for handling the semiconductor arrangement 100 during the securing process, said second carrier being secured to the second surface 102 of the semiconductor arrangement 100. Said second carrier 300 can be secured to the second surface 102 as early as during the process for producing the semiconductor arrangement 100, that is to say even before the semiconductor arrangement 100 has been completed. FIGS. 9A-9C show one example of such a production process in which the second carrier 300 is present as early as during the process for producing the semiconductor arrangement 100. This method provides for realizing the via 30 such that it extends from the second surface 12 of the semiconductor layer 10, said second surface facing the second insulation layer 40, right into the semiconductor layer 10, but does not extend through the semiconductor layer 10. An arrangement comprising such a via is shown in FIG. 9A.

The method furthermore comprises removing material of the semiconductor layer 10 at a surface facing away from the second surface 12 until the via 30 is exposed, that is to say until the via 30 passes from the second surface 12 of the semiconductor layer 10 through to an opposite surface, which forms the first surface 11 explained above. The result of this is shown in FIG. 9B.

Afterward, the first insulation layer 20 is produced on the first surface 11 of the semiconductor layer 10 in order to complete the semiconductor arrangement 100. The result of this is shown in FIG. 9C. Producing the first insulation layer 20 can comprise for example a deposition process, such as, for example, a CVD (Chemical Vapor Deposition) process, a PE-CVD (Plasma Enhanced Chemical Vapor Deposition) process or an HDP (High Density Plasma) process.

As mentioned, the via 30 can be configured in a wide variety of ways in order thereby to surround one or more regions of the semiconductor layer 10 in a ring-shaped fashion. Together with the first insulation layer 20, the via 30 forms a dielectrically isolating well surrounding the respective semiconductor region toward five sides.

Figure 10:
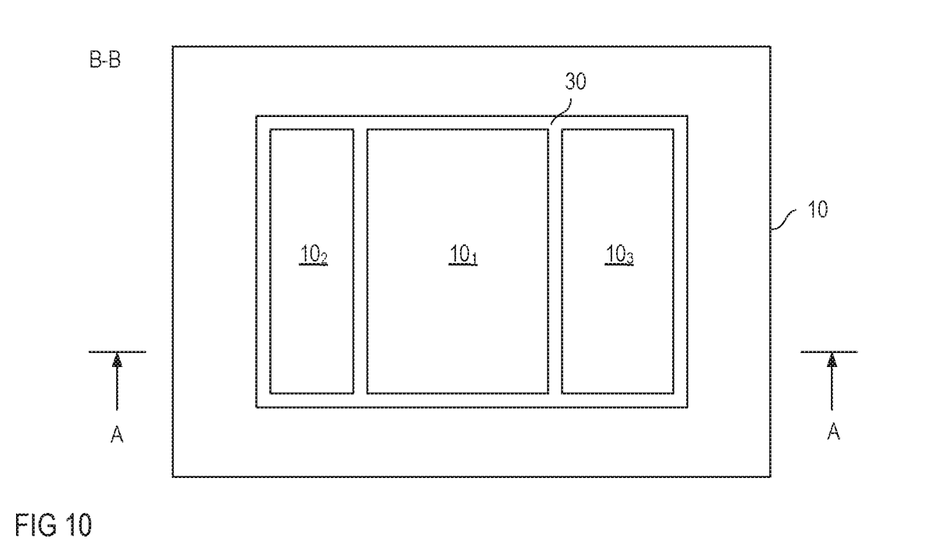
FIG. 10 shows a horizontal sectional view of a semiconductor layer of the semiconductor arrangement in accordance with one example.
Figure 11:
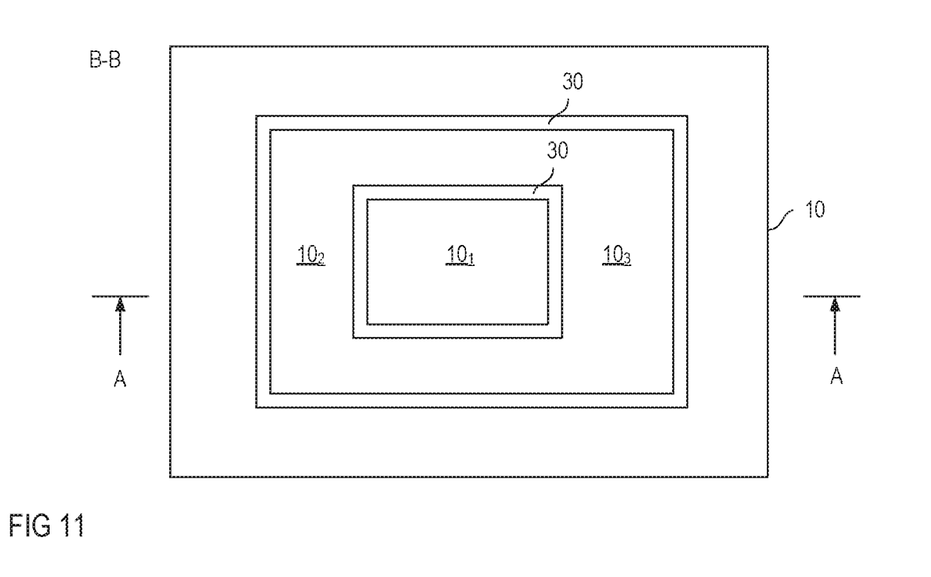
FIG. 11 shows a horizontal sectional view of a semiconductor layer of the semiconductor arrangement in accordance with a further example.

FIG. 10 shows a first example of the via 30 on the basis of a horizontal sectional view of the semiconductor layer 10. In the case of the example shown in FIG. 10, the via 30 comprises three ring-shaped sections respectively surrounding a semiconductor region $10_1$, $10_2$, $10_3$. FIG. 11 shows a further example. In the case of this example, the via 30 comprises two ring-shaped sections spaced apart from one another, wherein one of these ring-shaped sections surrounds another of these ring-shaped sections. As a result, two semiconductor regions are formed, a first semiconductor region $10_1$, which is defined by one of the ring-shaped sections, and another semiconductor region $10_2$, $10_3$, which is arranged between the two ring-shaped sections of the via 30, is defined by these ring-shaped sections and surrounds the first semiconductor region $10_1$ in a ring-shaped fashion. The regions $10_2$ and $10_3$ shown in the cross-sectional illustration in FIG. 1 are part of the ring-shaped semiconductor region in this example. It goes without saying that the examples shown in FIGS. 10 and 11 are merely two of a multiplicity of different examples of how the via 30 can be realized in order to define at least one semiconductor region in the semiconductor layer 10 that is surrounded by the via in a ring-shaped fashion.

Figure 12:
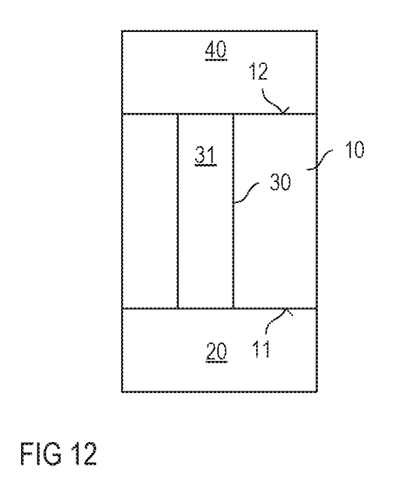
FIG. 12 shows a via arranged in the semiconductor layer of the semiconductor arrangement in accordance with one example.
Figure 13:
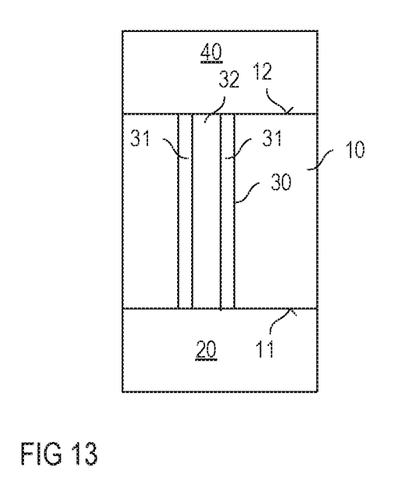
FIG. 13 shows a via arranged in the semiconductor layer of the semiconductor arrangement in accordance with a further example.

The via 30 itself can be realized in various ways, as is illustrated with reference to FIGS. 12 and 13. In accordance with the example shown in FIG. 12, provision is made for the via 30 to consist of just a single electrically insulating material 31, such as an oxide, for example. In accordance with a further example illustrated in FIG. 13, provision is made for the electrically insulating material 31 to be provided only along an interface between the via 30 and the semiconductor layer 10, as a result of which two insulating layers situated opposite one another are formed along the interfaces between the semiconductor layer 10 and the via 30. An interspace between these insulating layers can be filled with a gas, such as air, for example, or some other solid material 32. This other solid material 32 can be an insulation material or else an electrically conductive material.

Figure 14:
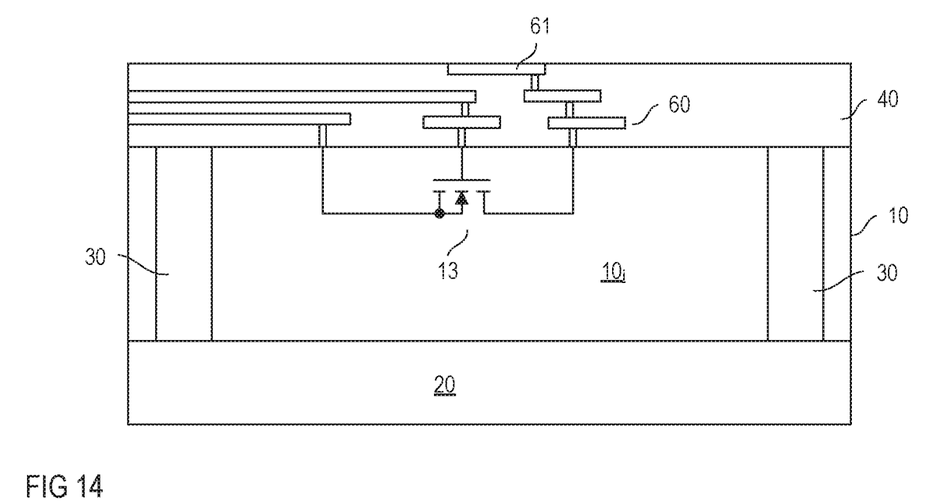
FIG. 14 illustrates one example of a region of the semiconductor layer in which a semiconductor component is integrated, and of a second insulation layer with a wiring structure arranged therein, said second insulation layer being arranged above said semiconductor region.

As mentioned, any desired types of semiconductor components or integrated circuits can be arranged in the at least one semiconductor region defined by the via 30. FIG. 14 shows a semiconductor region $10_i$, which can be any one of the semiconductor regions $10_1$, $10_2$, $10_3$ explained above, in detail. In accordance with one example, provision is made for integrating a power transistor, in particular a lateral power transistor, in this semiconductor region $10_i$. Said lateral power transistor 13 can be realized in any conventional manner, and so details regarding the concrete realization of said power transistor 13 are dispensed with in FIG. 14 and said power transistor 13 is illustrated merely on the basis of its circuit symbol. Merely as an example, said circuit symbol represents an n-conducting MOSFET. It goes without saying that it is also possible to realize any other type of power transistor, i.e. a different type of MOSFET (Metal Oxide Semiconductor Field-Effect Transistor), an IGBT (Insulated Gate Bipolar Transistor), a JFET (Junction Field-Effect Transistor), a bipolar junction transistor (BJT). Referring to FIG. 14, a wiring structure 40 can be provided in the second insulation layer 40, said wiring structure being connected to terminals of the power transistor 13 and serving to connect the power transistor 13 to other components or integrated circuits that are integrated in a different semiconductor region than the semiconductor region $10_i$. Furthermore, the wiring structure 60 can have a contact pad 61 at a surface 41 of the second insulation layer 40 facing away from the semiconductor layer 10, which can serve for externally contacting one or more terminals of the power transistor.

Figure 15:
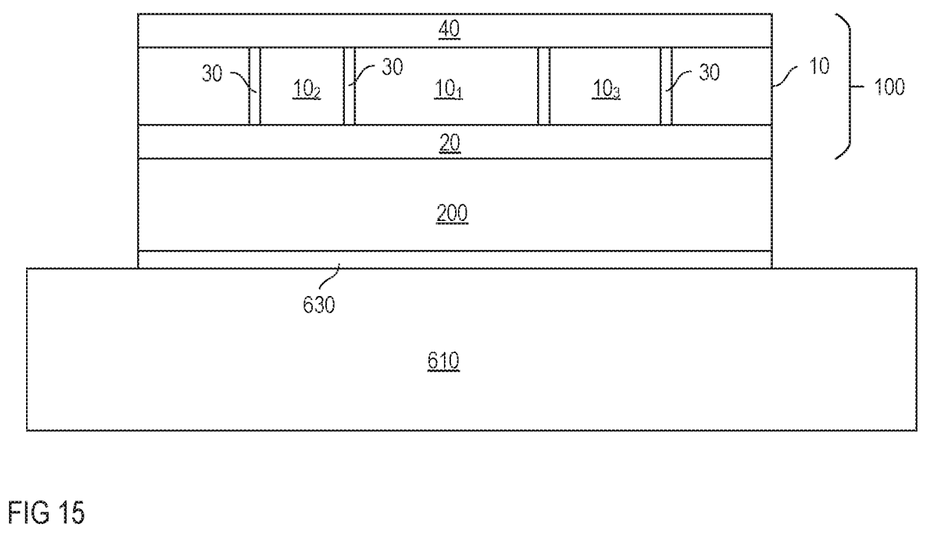
FIG. 15 illustrates one example of an arrangement comprising the semiconductor arrangement and the first carrier after securing the first carrier on a further carrier.

The overall arrangement comprising the semiconductor arrangement 100 and the carrier 200 permanently secured to the semiconductor arrangement 100 can be secured on a further carrier 610, the result of which is shown in FIG. 15. Securing the arrangement comprising the semiconductor arrangement 100 and the first carrier 200 to the further carrier 610 can comprise any desired securing method using any desired type of securing layer 630. Examples of such a securing method are a soldering method, wherein the securing layer 630 is a solder layer, or an adhesive-bonding method, wherein the securing layer 630 is an adhesive layer. The further carrier 610 is a metallic leadframe, for example. The arrangement shown in FIG. 15 can be accommodated in a package (not illustrated). Said package is an injection-molded package, for example, which can be produced by injection molding a plastics compound around the arrangement shown. Terminal legs can project from said package and/or the latter can have exposed contact pads enabling external contacting of the at least one semiconductor component integrated in the semiconductor layer and/or the at least one electronic circuit integrated in the semiconductor layer.

Without being restricted thereto, the following numbered examples illustrate one or more aspects of the present description.

Example 1. A method comprising: permanently securing a first carrier to a first surface of a semiconductor arrangement, wherein the semiconductor arrangement comprises: a semiconductor layer; a first insulation layer arranged on the semiconductor layer and facing the first surface of the semiconductor arrangement; and an insulating via extending in a vertical direction through the semiconductor layer as far as the first insulation layer, said insulating via surrounding a region of the semiconductor layer in a ring-shaped fashion.

Example 2. The method according to example 1, wherein permanently securing the first carrier to the first surface of the semiconductor arrangement comprises: contacting the first surface of the first carrier with the first insulation layer; and carrying out a thermal process at temperatures of less than 350° C.

Example 3. The method according to example 1 or 2, wherein the first carrier comprises an insulation layer at least along the first surface.

Example 4. The method according to an arbitrary combination of examples 1 to 3, wherein the insulation layer of the first carrier is of the same type as the first insulation layer of the semiconductor arrangement.

Example 5. The method according to an arbitrary combination of examples 1 to 4, wherein the first carrier comprises a layer composed of a material selected from: a semiconductor material; a metal; and a glass.

Example 6. The method according to an arbitrary combination of examples 1 to 5, wherein the first insulation layer is an oxide layer, and wherein the first carrier consists of a semiconductor material.

Example 7. The method according to an arbitrary combination of examples 1 to 6, wherein permanently securing the first carrier to the first surface of the semiconductor arrangement comprises: adhesively bonding the first carrier onto the first surface of the semiconductor arrangement by means of an adhesive layer.

Example 8. The method according to an arbitrary combination of examples 1 to 7, wherein the adhesive layer comprises BCB.

Example 9. The method according to an arbitrary combination of examples 1 to 8, wherein permanently securing the first carrier to the first surface of the semiconductor arrangement comprises: adhesively bonding the first carrier onto the first surface of the semiconductor arrangement by means of a solder layer.

Example 10. The method according to an arbitrary combination of examples 1 to 9, wherein the first surface of the semiconductor arrangement is formed by the insulation layer.

Example 11. The method according to an arbitrary combination of examples 1 to 10, wherein the semiconductor arrangement furthermore comprises a metallization on the first insulation layer, wherein the metallization forms the first surface of the semiconductor arrangement.

Example 12. The method according to an arbitrary combination of examples 1 to 11, wherein permanently securing the first carrier to the first surface of the semiconductor arrangement comprises: securing a second carrier to a second surface of the semiconductor arrangement, said second surface facing away from the first surface, before permanently securing the first carrier to the first surface; securing the first carrier to the first surface of the semiconductor arrangement; and removing the second carrier from the second surface.

Example 13. The method according to an arbitrary combination of examples 1 to 12, wherein the semiconductor arrangement comprises a second insulation layer arranged between the semiconductor layer and the second surface.

Example 14. The method according to an arbitrary combination of examples 1 to 13, wherein at least one semiconductor component is integrated in the region of the semiconductor layer which is surrounded by the via in a ring-shaped fashion, and wherein a wiring structure is arranged in the first insulation layer, said wiring structure contacting the at least one semiconductor component.

Example 15. The method according to an arbitrary combination of examples 1 to 14, wherein producing the semiconductor arrangement before permanently securing the first carrier to the first surface comprises: producing the via in such a way that it ends in the semiconductor layer; reducing a thickness of the semiconductor layer in such a way that the via is exposed at the first surface of the semiconductor layer; producing the first insulation layer on the first surface of the semiconductor layer, wherein before reducing the thickness of the semiconductor layer, the second carrier is secured to the second surface of the semiconductor arrangement.

Example 16. The method according to an arbitrary combination of examples 1 to 15, wherein the semiconductor arrangement is part of a wafer comprising a multiplicity of semiconductor arrangements, wherein the first carrier is applied simultaneously on the respective first surfaces of the multiplicity of semiconductor arrangements in order to form a wafer arrangement, and wherein the wafer arrangement is divided.

Example 17. The method according to an arbitrary combination of examples 1 to 16, furthermore comprising: securing the first carrier to a third carrier after the permanent securing to the first surfaces of the semiconductor arrangement.

Example 18. The method according to an arbitrary combination of examples 1 to 17, wherein the third carrier is a leadframe.

Example 19. The method according to an arbitrary combination of examples 1 to 18, furthermore comprising: reducing a thickness of the first carrier proceeding from a surface facing away from the semiconductor arrangement after securing the first carrier to the first surface of the semiconductor arrangement.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   producing a semiconductor arrangement having a semiconductor layer, a first insulation layer arranged on the semiconductor layer and facing a first surface of the semiconductor arrangement, and an insulating via extending in a vertical direction through the semiconductor layer as far as the first insulation layer, the insulating via surrounding a region of the semiconductor layer in a ring-shaped fashion;
   permanently securing a first carrier to the first surface of the semiconductor arrangement;
   before permanently securing the first carrier to the first surface of the semiconductor arrangement, securing a second carrier to a second surface of the semiconductor arrangement, the second surface facing away from the first surface; and
   after permanently securing the first carrier to the first surface of the semiconductor arrangement, removing the second carrier from the second surface.

2. The method of claim 1, wherein permanently securing the first carrier to the first surface of the semiconductor arrangement comprises:
   contacting a first surface of the first carrier with the first insulation layer; and
   carrying out a thermal process at temperatures of less than 350° C.

3. The method of claim 2, wherein the first carrier comprises an insulation layer at least along the first surface of the first carrier.

4. The method of claim 3, wherein the insulation layer of the first carrier is of a same type as the first insulation layer of the semiconductor arrangement.

5. The method of claim 2, wherein the first carrier comprises a layer composed of a material selected from the group consisting of:
   a semiconductor material;
   a metal; and
   a glass.

6. The method of claim 2, wherein the first insulation layer is an oxide layer, and wherein the first carrier consists of a semiconductor material.

7. The method of claim 1, wherein permanently securing the first carrier to the first surface of the semiconductor arrangement comprises:
   adhesively bonding the first carrier onto the first surface of the semiconductor arrangement by an adhesive layer.

8. The method of claim 7, wherein the adhesive layer comprises benzocyclobutene.

9. The method of claim 1, wherein permanently securing the first carrier to the first surface of the semiconductor arrangement comprises:
   adhesively bonding the first carrier onto the first surface of the semiconductor arrangement by a solder layer.

10. The method of claim 1, wherein the first surface of the semiconductor arrangement is formed by the insulation layer.

11. The method of claim 1, wherein the semiconductor arrangement further comprises a metallization on the first insulation layer, and wherein the metallization forms the first surface of the semiconductor arrangement.

12. The method of claim 1, wherein the semiconductor arrangement comprises a second insulation layer arranged between the semiconductor layer and the second surface.

13. The method of claim 12, wherein at least one semiconductor component is integrated in the region of the semiconductor layer which is surrounded by the via in a ring-shaped fashion, and wherein a wiring structure is arranged in the first insulation layer, the wiring structure contacting the at least one semiconductor component.

14. The method of claim 1, wherein producing the semiconductor arrangement comprises:
forming the via such that the via ends in the semiconductor layer;
reducing a thickness of the semiconductor layer such that the via is exposed at a first surface of the semiconductor layer;
producing the first insulation layer on the first surface of the semiconductor layer,
wherein before reducing the thickness of the semiconductor layer, the second carrier is secured to the second surface of the semiconductor arrangement.

15. The method of claim 1, wherein the semiconductor arrangement is part of a wafer comprising a multiplicity of semiconductor arrangements, wherein the first carrier is applied simultaneously on respective first surfaces of the multiplicity of semiconductor arrangements to form a wafer arrangement, and wherein the wafer arrangement is divided.

16. The method of claim 1, further comprising:
securing the first carrier to an additional carrier after the first carrier is permanently secured to the first surface of the semiconductor arrangement.

17. The method of claim 16, wherein the additional carrier is a leadframe.

18. The method of claim 1, further comprising:
reducing a thickness of the first carrier proceeding from a surface facing away from the semiconductor arrangement after permanently securing the first carrier to the first surface of the semiconductor arrangement.

19. The method of claim 1, further comprising:
integrating a semiconductor component and/or a semiconductor circuit in the region of the semiconductor layer surrounded by the insulating via in the ring-shaped fashion.

20. The method of claim 19, wherein integrating a semiconductor component and/or a semiconductor circuit in the region of the semiconductor layer surrounded by the insulating via in the ring-shaped fashion comprises:
integrating a lateral power transistor in the region of the semiconductor layer surrounded by the insulating via in the ring-shaped fashion.

\* \* \* \* \*